United States Patent [19]

Aronowitz

[11] Patent Number: 4,689,667
[45] Date of Patent: Aug. 25, 1987

[54] METHOD OF CONTROLLING DOPANT DIFFUSION AND DOPANT ELECTRICAL ACTIVATION BY IMPLANTED INERT GAS ATOMS

[75] Inventor: Sheldon Aronowitz, San Jose, Calif.

[73] Assignee: Fairchild Semiconductor Corporation, Cupertino, Calif.

[21] Appl. No.: 743,556

[22] Filed: Jun. 11, 1985

[51] Int. Cl.$^4$ .................. H01L 29/167; H01L 29/00; H01L 21/04
[52] U.S. Cl. ........................... 357/63; 357/7; 357/90; 357/91; 437/25
[58] Field of Search ............... 357/7, 63, 64, 90, 91

[56] References Cited

U.S. PATENT DOCUMENTS

| | | | |
|---|---|---|---|
| 3,796,929 | 3/1974 | Nicholas et al. | 357/91 |
| 4,053,925 | 10/1977 | Burr et al. | 357/91 |
| 4,151,011 | 4/1979 | Mihashi et al. | 357/63 |
| 4,452,644 | 6/1984 | Bruel et al. | 357/91 |

OTHER PUBLICATIONS

W. K. Chu et al., "Interference of Arsenic Diffusion by Argon Implantation", Radiation Effects 49, 23 (1980).
S. Aronowitz, "Quantum-Chemical Modeling of Boron and Noble Gas Dopants in Silicon", J. App. Phys. 54, 3930 (1983).
A. Milgram et al., "Effect of Argon Implantation on the Activation of Boron Implanted in Silicon", Appl. Phys. Lett. 42, 878 (1983).
V. D. Tkachev et al., "Noble Gas Atoms as Chemical Impurities in Silicon", Phys. Stat. Sol. (a) 81, 313 (1984).
M. Delfino et al., "Epitaxial Regrowth of Silicon Implanted with Argon and Boron", Appl. Phys. Lett. 44, 594 (1984).

Primary Examiner—Gene M. Munson
Attorney, Agent, or Firm—David H. Sitrick

[57] ABSTRACT

A method for preparing semiconductor components having a structure with sharply defined spatial distributions of dopant atoms with control over the degree of electrical activation of the dopant atoms. Control of spatial distribution and the degree of electrical activation of dopant atoms is achieved by implantation of dopant atoms along with rare gas atoms and another type of dopant atom within substantially the same preselected depth boundaries of a silicon or germanium substrate.

12 Claims, 6 Drawing Figures

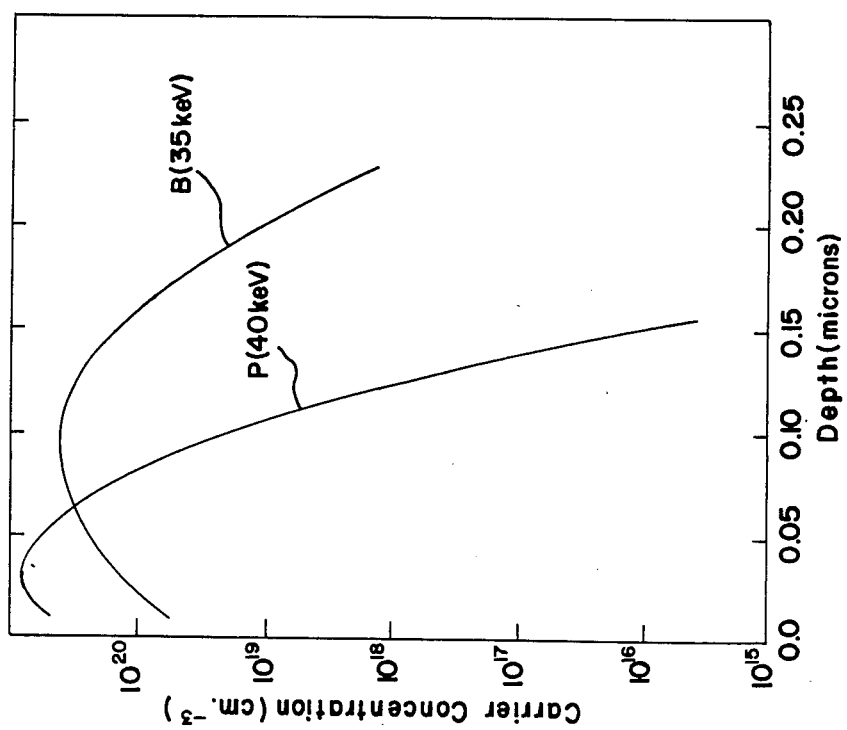
FIG-4-
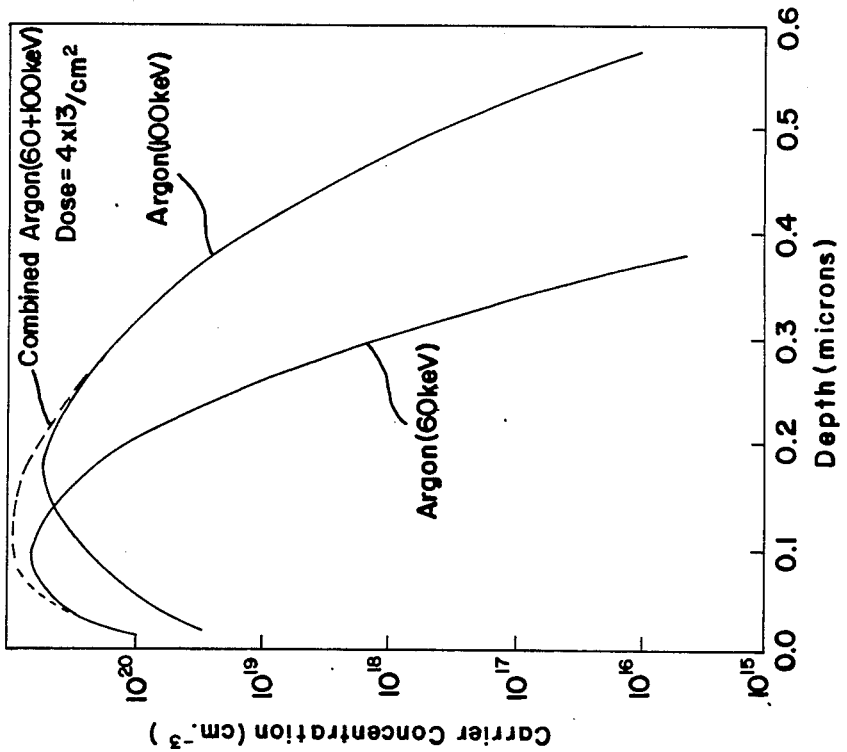
FIG-3-

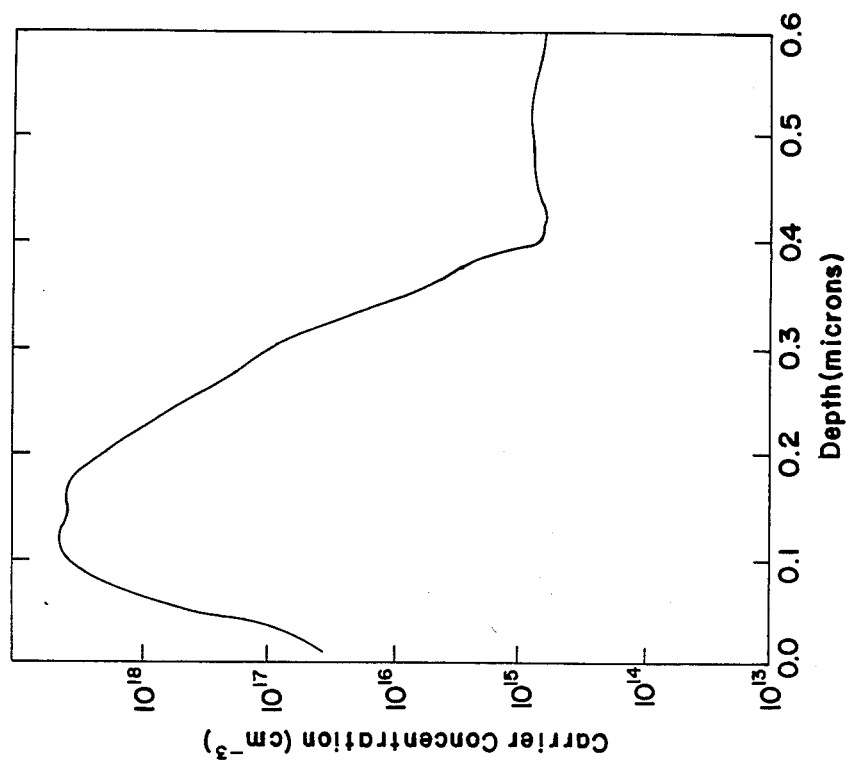
FIG-6-
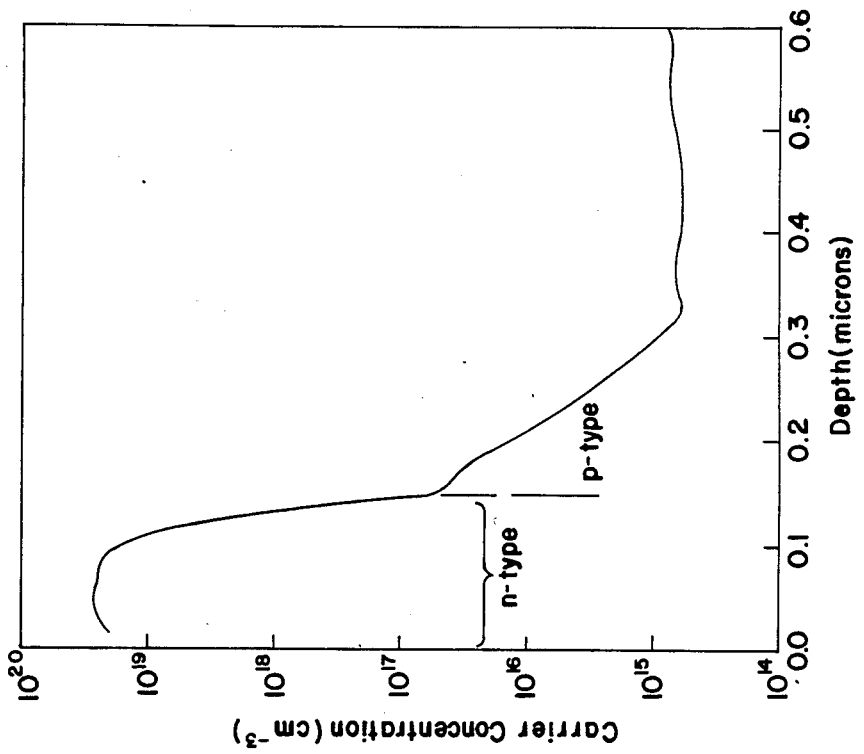
FIG-5-

METHOD OF CONTROLLING DOPANT DIFFUSION AND DOPANT ELECTRICAL ACTIVATION BY IMPLANTED INERT GAS ATOMS

The present invention relates to a method for preparing semiconductor components having a structure with sharply defined spatial distributions of dopant impurity atoms. The structure further includes dopant impurity interactions which enable controlled electrical activation of a portion of the dopant atoms in a semiconductor substrate. More particularly, this invention relates to a method for preparing semiconductor components having a structure with sharply defined spatial distributions of dopant atoms and controlled electrical activation of a portion of the n- or p-type dopant atoms implanted along with rare gas atoms and another type of dopant atom within substantially the same preselected depth boundaries of a silicon or germanium substrate.

In the semiconductor industry there is a constant effort toward development of semiconductor components having smaller size dimensions for various elements which make up each of the components. An important limitation on the size of each component structure is the thickness of various doped regions, such as n- and p-type layers. In order to prepare these devices for various applications, the dopant atoms are diffused or are implanted into a semiconductor substrate. The dopant atoms in the n- and p-type layers are activated for carrying out electrical operations as part of a planned device structure. Typically such diffusion and activation operations are accomplished by annealing the component at elevated temperatures for relatively long times. These high temperatures and long annealing times often result in the broadening of doped layer thickness and/or lateral diffusion of dopant species which can expand the extent of the doped area into undesired regions. In extreme situations the high temperature and long annealing times can even lead to unwanted electrical shorting of sections of the device which are intended to be electrically isolated from one another, or cause formation of regions which have dopant atom characteristics opposite the desired type, such as p-type instead of n-type. Furthermore, it has been difficult to confine the extent of the desired distribution of dopant atoms while electrically activating selected dopant regions. Some measure of control of electrical activation and the spatial distribution of p-type boron dopant has been achieved by implanting argon atoms in the same range as boron. (See, for example, A. Milgram and M. Delfino, "Effect of Argon Implantation on the Activation of Boron Implanted in Silicon", Appl. Phys. Lett. 42 (10), 1983, which is incorporated by reference herein). However, attempts to activate n-type arsenic dopant atoms present with argon have been unsuccessful because the radiation damaged substrate could not be recrystallized using ordinary equilibrium annealing treatments, making final device preparation more costly and difficult.

BRIEF SUMMARY OF THE INVENTION

One of the primary objects of the present invention is to provide an improved method for preparing semiconductor components having controllable electrical activation of dopant atoms and providing sharply defined distributions of dopant atoms in a semiconductor substrate.

Another object of the invention is to provide an improved method for preparing microelectronic circuit components having a semiconductor structure which enables control of electrical activation of dopant atoms and has sharply defined dopant distributions in a silicon or geranium substrate.

A more particular object of the invention is to provide an improved method for preparing semiconductor components having a structure with implanted dopant atoms and rare gas atoms within the same preselected depth boundaries of a silicon or germanium substrate, wherein diffusivity of these dopant atoms is attenuated, and the electrical activation of a selected type of dopant atom is controlled by the presence of the rare gas atoms in conjunction with one or more other types of dopant atoms.

An additional object of the invention is to provide an improved method for preparing semiconductor devices having depth regions of implanted dopant atoms, such as arsenic, boron and phosphorus, along with argon gas atoms and interactions among the implanted atoms retards selected dopant atom diffusion and enables control of electrical activation of the arsenic, boron or phosphorus dopant atoms.

In accordance with the present invention there is provided a method for preparing semiconductor components which have dopant atoms and rare gas atoms disposed within preselected depth boundaries in a semiconductor substrate. Interactions between the rare gas atoms and predetermined dopant atom species enable control of depth boundaries and lateral distribution of dopant atoms in the substrate and also enable control of the degree of electrical activation of selected ones of the dopant atom species.

BRIEF DESCRIPTION OF THE DRAWINGS

These and other features and advantages of the present invention will become apparent from the following description of the drawings, wherein:

FIG. 3 illustrates the separate and combined relative distributions of argon atoms implanted at 60 keV and 100 keV into (100) silicon;

FIG. 4 illustrates the relative distributions of phosphorus, argon and boron implanted into (100) silicon at selected energies;

FIG. 5 shows the n- and p-type dopant carrier concentrations versus depth in (100) silicon implanted with argon, boron and arsenic; and FIG. 6 shows the p-type dopant carrier concentrations versus depth in (100) silicon implanted with argon, boron and arsenic.

DETAILED DESCRIPTION

Figure 1:
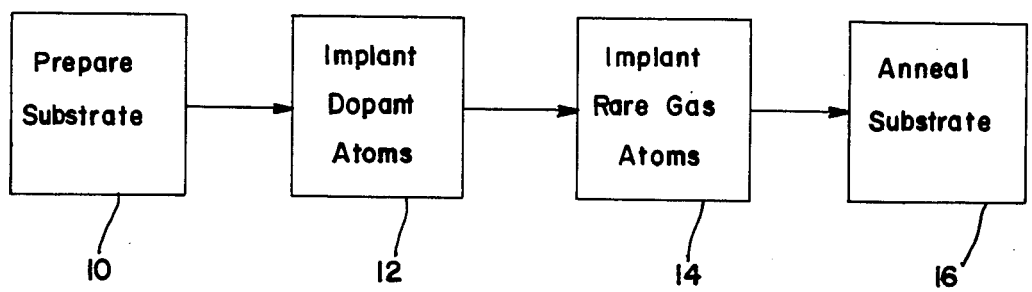
FIG. 1 illustrates a block diagram of a method of preparing a semiconductor device having sharply defined dopant atom distributions and control of electrical activation of dopant atoms.

Referring to FIG. 1, one form of the invention is shown in a flow chart of a method of preparing a semiconductor structure in accordance with the invention. In step 10 a semiconductor substrate is prepared by first selecting the desired intrinsic p- or n-type silicon or germanium having a preselected top surface orientation, typically the (100) plane, and having a preselected resistivity characteristic of dopant type and concentration. As part of the substrate preparation, oxide of about 0.02–0.05 microns is generated on the surface of the silicon or germanium to passivate the material against unwanted impurities and minimize channeling during implantation.

The semiconductor substrate is then subjected to a series of preparation steps which enable formation of functional semiconductor regions used for constructing an operating device, such as a CMOS (compensated metal/oxide/semiconductor) transistor. In the generic sense, the instant invention is applicable to the construction of any microelectronic device which can benefit from: (a) improved control of dopant atom electrical activation and (b) maintaining the sharpness or degree of confinement of dopant atom distributions by attenuating dopant atom diffusivity in the semiconductor substrate. This attenuation in diffusivity yields a substantially sharper curvature of carrier concentration at the boundaries and thus more definitive semiconductor electrical properties.

Improvement in the control of dopant atom activation and attenuation of dopant atom distributions in the semiconductor substrate is accomplished in step 12 of FIG. 1. A preselected first dopant is introduced into a substrate region within preselected depth boundaries in the substrate. For example, as shown in FIG. 1, the dopant atoms are introduced by ion implantation. The substrate has predetermined concentrations of both a rare gas, such as argon, neon or krypton, and at least a second type of dopant atom. Interactions among these three or more extrinsic atom types enables equilibrium annealing treatments to be performed with improved control of dopant electrical activation and attenuation of dopant atom distributions. One possible explanation for these properties is that stable complexes are formed among the dopant atoms and the rare gas, causing an attenuation in the diffusivity of selected ones of the dopant atoms. Substrate recrystallization, which is necessary for efficient and proper device operation, can proceed under the usual equilibrium annealing treatment because the rare gas atoms do not agglomerate to form bubbles which hinder recrystallization. Thus, there is no need for use of extraordinary or expensive means, such as laser regrowth methods.

In a preferred form of the invention in step 14 of FIG. 1, neon or argon ions are implanted into the semiconductor substrate, such as single crystal silicon or germanium, by an ion implantation apparatus which in a known manner ionizes and accelerates the ions to a predetermined energy. The energy, or energies, of the ions are predetermined according to the desired depth region thickness having preselected depth boundaries and associated atom distribution. For example, if a surface region of a (100) silicon substrate is to be implanted with dopant atoms to be active to a depth of 0.3 micrometers, the argon ion energy should be about 100 keV.

Figure 2:
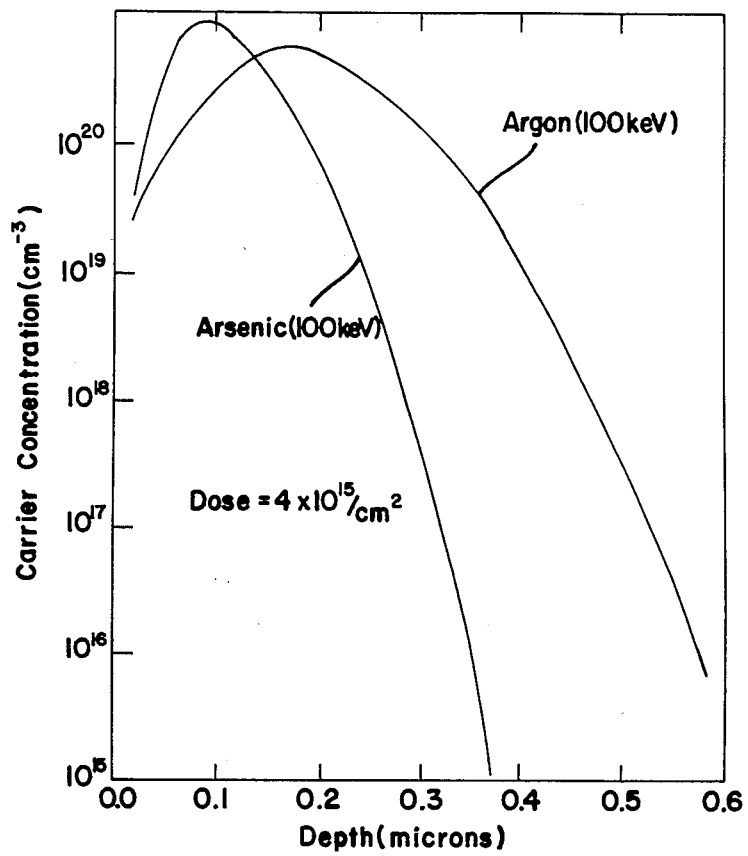
FIG. 2 illustrates relative distribution in a (100) silicon substrate of argon atoms implanted at 100 keV energy and of arsenic implanted at 100 keV energy.

As shown in FIG. 2 the implanted distributions for 100 keV argon atoms extends from the surface to a depth of about 0.3 micrometers which is within the depth region of the dopant atom, enabling interaction of the desired rare gas-dopant atoms in order to achieve the desired behavior. The concentration of argon necessary to attenuate diffusivity of selected dopant atom diffusion is determinable from test sample runs with various ratios of argon atoms to dopant atoms. (See Examples 1–10 for various comparisons with and without inert gas atoms present).

In another form of the invention additional control of the uniformity of the depth distribution of inert gas atom concentration is achievable by combining the implanted atom distributions associated with several ion energies, for example, as shown in FIG. 3 wherein 60 and 100 keV argon atom distributions are combined. This combination achieves a relatively uniform distribution of argon atom concentration from the surface to the lower depth boundary.

In order to achieve the desirable attenuation of dopant atom distribution and control of electrical activation of dopant atoms, at least one more type of dopant atom is implanted along with the inert gas (for example, neon or argon) atoms and the first dopant atom. Further, these dopant atoms should be substantially within the same preselected depth boundaries as the argon atoms. The first type of dopant atom is usually chosen for satisfying the desired electrical properties necessary for the dopant region of the microelectronic component. For example, for n-type character, lithium, phosphorus, arsenic, antimony and bismuth are usable, and for p-type character, boron, aluminum, gallium and indium are usable.

The second dopant plays an interactive role with the argon to control electrical activation and attenuate the spatial distribution of the first dopant atom. However, the second dopant atoms can also take on an active electrical role in the microelectronic device. For example, if it is desired to have an n-type surface region or layer with a maximum depth of 0.9 micrometers, the combination of argon, boron and phosphorus is implanted in the substrate with the internal preselected depth boundary of the n-type dopant (such as phosphorus) near 0.9 micrometers. If a deeper p-type layer is desired next to the n-type surface layer, the boron is implanted to the desired depth.

The concentrations of deposited atoms also are adjusted to provide the desired electrical activation for the n-type surface layer. As shown in FIG. 4 the phosphorus distribution and boron distribution are offset somewhat to achieve this desired surface n-type layer arising from phosphorus dopat atoms and adjacent p-type buried layer arising from boron dopant atoms. The atom distributions of FIG. 4 produce the electrical characteristics of Example 14 wherein the implantation energy for argon is 100 keV, for boron is 35 keV and for phosphorus is 40 keV. The doses shown in FIG. 4 are for $4 \times 10^{15}/cm^2$ and can be converted to the doses of Example 14 by multiplying by the new dose divided by $4 \times 10^{15}/cm^2$. The interaction of the argon and boron with the phosphorus causes retardation of phosphorus diffusion and provides a well confined n-type region with a sharp curvature associated with the phosphorous depth boundary within the silicon substrate. Further, the buried p-type boron region also experiences a similar attenuation of boron diffusion and prevents reduction of active n-type character in the adjacent layer. Also the degree of electrical activation of the n-type phosphorus is controllable by varying the concentrations of the argon and boron with respect to the phosphorous concentration. By selecting appropriate ion implantation energies and total dose concentration, the depth of the surface n-type region and the electrical activation of the phosphorus dopant is adjustable to the desired magnitudes (e.g., see Examples 6 and 14).

Various exemplary combinations of n- and p-type dopant atoms for the first and second dopant atoms comprise: Li/B, Li/Al, Li/Ga, Li/In, P/B, P/Al, P/Ga, P/In, As/B, As/Ga, As/In, Sb/B, Sb/Al, Sb/Ga, Sb/In, Bi/B, Bi/Ga, Bi/In, Bi/Li, B/P, B/As, B/Sb, B/Bi, Al/Li, Al/P, Al,As, Al/Sb, Al/Bi, Ga/Li, Ga/P, Ga/As, Ga/Sb, Ga/B, In/Li, In/P, In/As, In/Sb and In/Bi.

The effectiveness of argon and the second type of dopant compared with argon alone can be illustrated by the example of an n-type surface region arising from implantation of arsenic atoms. Previous work has determined argon in combination with arsenic in a substrate is substantially ineffective in controlling the degree of electrical activation of the arsenic (see, for example, E. Rimini, W-K Chu, J. E. E. Baglin, T. Y. Tan and R. T. Hodgson, Appl, Phys. Lett. 37, 81 (1980), incorporated by reference herein). Furthermore, arsenic does not prevent agglomeration of argon atoms to form gas bubbles, and gas bubbles greatly hinder recrystallization of the radiation damaged layer during the equilibrium annealing treatments of step 16 in FIG. 1.

By utilizing argon and boron in conjunction with arsenic, the electrical activity of the surface region is adjustable from strongly n-type to p-type as shown in FIGS. 5 (Example 24) and 6 (Example 23). Also see, Examples 2, 10 and 21. In FIG. 5, the concentrations are $2 \times 10^{15}$ Ar+/cm$^2$, $6 \times 10^{12}$ B+/cm$^2$, and $6 \times 10^{15}$ As+/cm$^2$ and the sample was annealeod at 900° C. for 180 minutes. In FIG. 6, the concentrations are $6 \times 10^{15}$ Ar+/cm$^2$, $6 \times 10^{15}$ As+/cm$^2$ and $6 \times 10^{14}$ B+/cm$^2$ with the same anneal as for Example 24. Furthermore, the diffusion of arsenic away from the implanted zone is substantially attenuated, and the arsenic along with the boron acts to prevent argon from forming gas bubbles, which would act as a barrier to recrystallization of the radiation damaged layer. These examples point out an important advantage of the invention which arises from the interactions among the rare gas atoms and the first and second dopant atoms. From the Rimini et al. paper cited hereinbefore, it is believed that As atoms repel Ar atoms, and thus one would expect the desirable effects of B and Ar would be diminished by the addition of As. However, substantial improvements arise from the combination of B, Ar and As. As compared to the effect of B and Ar, the combination of B, Ar and As strongly attenuates the diffusion of dopant atoms. This interaction of these three species therefore enables equilibrium thermal annealing treatments in step 16 of FIG. 1 to be effective in recrystallizing the ion damaged regions. This recrystallization results in relatively defect-free regions suitable for intended electrical device operation. The interaction also permits recrystallization by equilibrium annealing treatments rather than requiring drastic measures, such as laser beam regrowth of the damaged zone.

The method of the present invention also includes formation of a device structure with a plurality of regions of predetermined electrical characteristics such as, for example, n-type layers, degenerate n-type surface layers or an adjacent buried p-type layer. For example, the previously discussed arsenic, boron and argon specimen (i.e., see Examples 10, 21 and FIG. 5 (Example 24)) has an n-type surface layer approximately 0.15 micrometers thick and an adjacent p-type region extending from 0.15 to 0.30 micrometers. This p-type region exhibits an exponentially decaying p-type dopant concentration. This general type of layered device can be extended to an even greater number of layers in order to satisfy the design needs. In addition a number of such layer regions can be positioned as needed at preselected sites laterally about the substrate. Numerous other uses of this method in various devices include the formation of p- and n-type channels between the various active devices on the substrate.

Additional control of the first dopant atom electrical activity is possible by using a third dopant species, such as nitrogen and oxygen implanted into the semiconductor substrate. In particular, the inclusion of oxygen and nitrogen enables improved containment of an n-type phosphorus dopant distribution in silicon (e.g., see Examples 15 and 16). Various examples of quaternary groups of atoms comprise Ar/As/B/N, Ar/As/B/O, Ar/P/B/N and Ar/P/B/O. The implantation of argon, boron, and nitrogen or oxygen results in a substantial improvement in the ability to form a narrow n-type surface layer (P, As, Sb, Bi, Li dopants, for example). The phosphorus and boron implanted semiconductor substrate has an n-type region extending from the surface to a preselected depth boundary of 0.6 micrometers. Upon the further addition of argon and oxygen or nitrogen, the n-type layer is reduced to a thickness of about 0.35 micrometers, and the curvature of cut-off of the n-type boundary is much sharper. Even though there is a substantial improvement in retarding phosphorus diffusion, there is only a minor decrease in electrical activation of n-type dopant atoms. (Compare Example 14 and 15).

EXAMPLES

Ion implantation was utilized to prepare a number of semiconductor components. In most cases (as indicated for each example) a thin oxide layer was produced on a silicon <100> wafer. Subsequently, ion implantations were carried out and were followed by thermal annealing under neutral ambient conditions. After preparation of the component, spreading resistance prfiles were measured as a function of depth into the specimens with data accumulated in accordance with the standards set forth in NBS Spec. Publ. 400–48 (May 1979), D. H. Dickey and J. R. Ehrstein "Semiconductor Measurement Technology: Spreading Resistance Analysis for Silicon Layers with Nonuniform Resistivity", which is incorporated by reference herein. For each example the results of these measurements are summarized with a set of n or p-type carrier concentration per cm$^3$ versus depth values in micrometers. The following examples involved use of argon as the inert gas dopant; however, other tests have been performed using neon, and the results were at least as favorable as for the argon examples.

EXAMPLE 1

After formation of a 500 Angstrom oxide layer, arsenic was implanted at 100 keV energy to an implant dose of about $1 \times 10^{15}$ atoms/cm$^2$. Subsequently boron was implanted at an energy of 35 keV to an implant dose of about $1 \times 10^{14}$ atoms/cm$^2$. The annealing treatment was performed at 1,000° C. for 120 minutes.

Representative values of carrier concentration per cm$^3$ and type (n or p), versus depth in microns (in parenthesis) are: $6 \times 10^{18}$n (0), $2 \times 10^{19}$n (0.1), $8 \times 10^{17}$n (0.2), $2 \times 10^{17}$p (0.3), $10^{17}$p (0.4) and $7 \times 10^{16}$p (0.5).

EXAMPLE 2

After formation of a 500 Angstrom oxide layer, argon was implanted at 100 keV energy to an implant dose of $1 \times 10^{15}$ atoms/cm$^2$. Subsequently, arsenic was implanted at an energy of 100 keV to an implant dose of about $1 \times 10^{15}$ atoms/cm$^2$. Boron was implanted at an energy of 35 keV to a dose of about $1 \times 10^{14}$ atoms/cm$^2$. The annealing treatment was performed at 1,000° C. for 120 minutes.

Representative values of carrier concentration per cm$^3$ and type (n or p), versus depth in microns (in parenthesis) are: $1 \times 10^{17}$p (0), $1 \times 10^{17}$p (0.1), $4 \times 10^{17}$p (0.2), $3.5 \times 10^{17}$p (0.3), $2 \times 10^{17}$p (0.4) and $5 \times 10^{16}$p (0.5).

EXAMPLE 3

After formation of a 500 Angstrom oxide layer, argon was implanted at 100 keV energy to an implant dose of $1 \times 10^{15}$ atoms/cm$^2$. Arsenic was implanted at 100 keV to a dose of about $1 \times 10^{15}$ atoms/cm$^2$ and boron was implanted at an energy of 35 keV to a dose of about $1 \times 10^{14}$ atoms/cm$^2$. Oxygen was then implanted at 90 keV to a dose of $1 \times 10^{15}$ atoms/cm$^2$. The annealing was performed at 1,000° C. for 120 minutes.

Representative values of carrier concentration per cm$^3$ and type (n or p), versus depth in microns (in parenthesis) are: $2 \times 10^{16}$p (0), $2 \times 10^{17}$p (0.1), $6 \times 10^{17}$p (0.15), $5 \times 10^{17}$p (0.2), $4.5 \times 10^{17}$p (0.3) and $2 \times 10^{17}$p (0.4) and $7 \times 10^{16}$p (0.5).

EXAMPLE 4

After formation of a 500 Angstrom oxide layer, argon was implanted at 100 keV energy to an implant dose of $1 \times 10^{15}$ atoms/cm$^2$. Arsenic was implanted at 100 keV to a dose of about $1 \times 10^{15}$ atoms/cm$^2$, boron was implanted at 35 keV to a dose of about $1 \times 10^{14}$ atoms/cm$^2$ and nitrogen was implanted at 40 keV to a dose of $1 \times 10^{15}$ atoms/cm$^2$. The annealing treatment was performed at 1,000° C. for 120 minutes.

Representative values of carrier concentration per cm$^3$ and type (n or p), versus depth in microns (in parenthesis) are: $3 \times 10^{16}$p (0), $6 \times 10^{16}$p (0.1), $6 \times 10^{17}$p (0.2), $3 \times 10^{17}$p (0.3), $10^{17}$p (0.4) and $4 \times 10^{16}$p (0.5).

EXAMPLE 5

After formation of a 500 Angstrom oxide layer, boron was implanted at 35 keV energy to an implant dose of about $1 \times 10^{14}$ atoms/cm$^2$. Subsequently, phosphorus was implanted at an energy of 40 keV to an implant dose of about $1 \times 10^{15}$ atoms/cm$^2$. The annealing treatment was performed at 1,000° C. for 120 minutes.

Representative values of carrier concentration per cm$^3$ and type (n or p), versus depth in microns (in parenthesis) are: $5 \times 10^{18}$n (0), $10^{19}$n (0.1), $10^{19}$n (0.2), $3 \times 10^{18}$n (0.4), $6 \times 10^{17}$n (0.5), $10^{15}$p (0.6S) and $1.5 \times 10^{15}$ p (0.8).

EXAMPLE 6

After formation of a 500 Angstrom oxide layer, argon was implanted at 100 keV energy to an implant dose of $1 \times 10^{15}$ atoms/cm$^2$. Subsequently, boron was implanted at an energy of 35 keV to an implant dose of about $1 \times 10^{14}$ atoms/cm$^2$. Phosphorus was implanted at an energy of 40 keV to a dose of about $1 \times 10^{15}$ atoms/cm$^2$. the annealing treatment was performed at 1,000° C. for 120 minutes.

Representative values of carrier concentration per cm$^3$ and type (n or p), versus depth in microns (in parenthesis) are: $2 \times 10^{18}$n (0), $7 \times 10^{18}$n (0.1), $6 \times 10^{18}$n (0.2), $6 \times 10^{17}$n (0.3), $10^{16}$n (0.4), $1.6 \times 10^{15}$p (0.42) and $1.5 \times 10^{15}$p (0.5).

EXAMPLE 7

After formation of a 500 Angstrom oxide layer, argon was implanted at 100 keV energy to an implant dose of $1 \times 10^{15}$ atoms/cm$^2$, boron was implanted at 35 keV to a dose of about $1 \times 10^{14}$ atoms/cm$^2$, oxygen was implanted at an energy of 90 keV to a dose of $1 \times 10^{15}$ atoms/cm$^2$ and phosphorus was implanted at 40 keV to a dose of about $1 \times 10^{15}$ atoms/cm$^2$. The annealing was performed at 1,000° C. for 120 minutes.

Representative values of carrier concentration per cm$^3$ and type (n or p), versus depth in microns (in parenthesis) are: $7 \times 10^{17}$n (0.05), $2 \times 10^{18}$n (0.1), $5 \times 10^{18}$n (0.2), $6 \times 10^{17}$n (0.3), $3 \times 10^{15}$p (0.35), $2 \times 10^{15}$p (0.4) and $1.8 \times 10^{15}$p (0.5).

EXAMPLE 8

After formation of a 500 Angstrom oxide layer, argon was implanted at 100 keV energy to an implant dose of $1 \times 10^{15}$ atoms/cm$^2$, boron was implanted at 35 keV to a dose of about $1 \times 10^{14}$ atoms/cm$^2$, nitrogen was implanted at an energy of 40 keV to a dose of $1 \times 10^{15}$ atoms/cm$^2$ and phosphorus was implanted at 40 keV to a dose of about $1 \times 10^{15}$ atoms/cm$^2$. The annealing was performed at 1,000° C. for 120 minutes.

Representative values of carrier concentration per cm$^3$ and type (n or p), versus depth in microns (in parenthesis) are: $2 \times 10^{18}$n (0.0), $6 \times 10^{18}$n (0.1), $5 \times 10^{18}$n (0.2), $5 \times 10^{17}$n (0.3), $1.5 \times 10^{15}$p (0.4) and $1.5 \times 10^{15}$p (0.6).

EXAMPLE 9

After formation of a 500 Angstrom oxide layer, arsenic was implanted at 100 keV energy to an implant dose of about $2 \times 10^{15}$ atoms/cm$^2$. Subsequently, boron was implanted at an energy of 35 keV to an implant dose of about $1 \times 10^{14}$ atoms/cm$^2$. The annealing treatment was performed at 1,000° C. for 120 minutes.

Representative values of carrier concentration per cm$^3$ and type (n or p), versus depth in microns (in parenthesis) are: $6 \times 10^{19}$n (0.0), $5 \times 10^{19}$n (0.1), $4 \times 10^{19}$n (0.2), $10^{17}$n (0.3), $1.5 \times 10^{17}$p (0.32), $8 \times 10^{16}$p (0.4) and $10^{16}$p (0.5).

EXAMPLE 10

After formation of a 500 Angstrom oxide layer, argon was implanted at 100 keV energy to an implant dose of $1 \times 10^{15}$ atoms/cm$^2$. Subsequently, arsenic was implanted at an energy of 100 keV to an implant dose of about $2 \times 10^{15}$ atoms/cm$^2$. Boron was implanted at an energy of 35 keV to a dose of about $1 \times 10^{14}$ atoms/cm$^2$. The annealing treatment was performed at 1,000° C. for 120 minutes.

Representative values of carrier concentration per cm$^3$ and type (n or p), versus depth in microns (in parenthesis) are: $10^{19}$n (0.0), $2 \times 10^{18}$n (0.1), $8 \times 10^{17}$n (0.12), $5 \times 10^{17}$p (0.2), $4 \times 10^{17}$p (0.3), $2 \times 10^{17}$p (0.4) and $4 \times 10^{16}$p (0.5).

EXAMPLE 11

After formation of a 500 Angstrom oxide layer, argon was implanted at 100 keV energy to an implant dose of $1 \times 10^{15}$ atoms/cm$^2$, arsenic was implanted at 100 keV to a dose of about $2 \times 10^{15}$ atoms/cm$^2$, boron was implanted at an energy of 35 keV to a dose of about $1 \times 10^{14}$ atoms/cm$^2$ and oxygen was implanted at 90 keV to a dose of $1 \times 10^{15}$ atoms/cm$^2$. The annealing was performed at 1,000° C. for 120 minutes.

Representative values of carrier concentration per $cm^3$ and type (n or p), versus depth in microns (in parenthesis) are: $9\times10^{18}$n (0.0), $10^{18}$n (0.1), $7\times10^{17}$p (0.15), $7\times10^{17}$p (0.2), $3\times10^{17}$p (0.3), $1.5\times10^{17}$p (0.4) and $5\times10^{17}$p (0.5).

EXAMPLE 12

After formation of a 500 Angstrom oxide layer, argon was implanted at 100 keV energy to an implant dose of $1\times10^{15}$ atoms/$cm^2$, arsenic was implanted at 100 keV to a dose of about $2\times10^{15}$ atoms/$cm^2$, boron was implanted at an energy of 35 keV to a dose of about $1\times10^{14}$ atoms/$cm^2$ and nitrogen was implanted at 40 keV to a dose of $1\times10^{15}$ atoms/$cm^2$. The annealing was performed at 1,000° C. for 120 minutes.

Representative values of carrier concentration per $cm^3$ and type (n or p), versus depth in microns (in parenthesis) are: $6\times10^{18}$n (0.0), $5\times10^{18}$n (0.05), $2\times10^{18}$n (0.1), $10^{17}$n (0.14), $2\times10^{17}$p (0.15), $3\times10^{17}$p (0.2), $5\times10^{17}$p (0.3), $1.6\times10^{17}$p (0.4) and $3\times10^{16}$p (0.5).

EXAMPLE 13

After formation of a 500 Angstrom oxide layer, boron was implanted at 35 keV energy to an implant dose of about $1\times10^{14}$ atoms/$cm^2$. Subsequently, phosphorus was implanted at an energy of 40 keV to an implant dose of about $2\times10^{15}$ atoms/$cm^2$. The annealing treatment was performed at 1,000° C. for 120 minutes.

Representative values of carrier concentration per $cm^3$ and type (n or p), versus depth in microns (in parenthesis) are: $8\times10^{18}$n (0.0), $2\times10^{19}$n (0.1), $2\times10^{19}$n (0.2), $1.2\times10^{19}$n (0.3), $10^{19}$n (0.4), $6\times10^{18}$n (0.5), $2\times10^{18}$n (0.7), $10^{16}$n (0.94), $2\times10^{15}$p (0.95), $2\times10^{15}$p (1.0) and $2\times10^{15}$p (1.2).

EXAMPLE 14

After formation of a 500 Angstrom oxide layer, argon was implanted at 100 keV energy to an implant dose of $1\times10^{15}$ atoms/$cm^2$. Subsequently, boron was implanted at an energy of 35 keV to an implant dose of about $1\times10^{14}$ atoms/$cm^2$. Phosphorus was implanted at an energy of 40 keV to a dose of about $2\times10^{15}$ atoms/$cm^2$. The annealing treatment was performed at 1,000° C. for 120 minutes.

Representative values of carrier concentration per $cm^3$ and type (n or p), versus depth in microns (in parenthesis) are: $5\times10^{18}$n (0.0), $10^{19}$n (0.2), $6\times10^{18}$n (0.4), $10^{18}$n (0.6), $10^{16}$n (0.78), $1.5\times10^{15}$p (0.8) and $1.5\times10^{15}$p (1.0).

EXAMPLE 15

After formation of a 500 Angstrom oxide layer, argon was implanted at 100 keV energy to an implant dose of $1\times10^{15}$ atoms/$cm^2$, boron was implanted at 35 keV to a dose of about $1\times10^{14}$ atoms/$cm^2$, oxygen was implanted at an energy of 90 keV to a dose of about $1\times10^{15}$ atoms/$cm^2$ and phosphorus was implanted at 40 keV to a dose of about $2\times10^{15}$ atoms/$cm^2$. The annealing was performed at 1,000° C. for 120 minutes.

Representative values of carrier concentration per $cm^3$ and type (n or p), versus depth in microns (in parenthesis) are: $9\times10^{18}$n (0.0), $10^{19}$n (0.2), $4\times10^{18}$n (0.4), $2\times10^{17}$n (0.6), $10^{16}$n (0.68), $2\times10^{15}$p (0.7) and $2\times10^{15}$p (1.0).

EXAMPLE 16

After formation of a 500 Angstrom oxide layer, argon was implanted at 100 keV energy to an implant dose of $1\times10^{15}$ atoms/$cm^2$, boron was implanted at 35 keV to a dose of about $1\times10^{14}$ atoms/$cm^2$, nitrogen was implanted at an energy of 40 keV to a dose of $1\times10^{15}$ atoms/$cm^2$ and phosphorus was implanted at 40 keV to a dose of about $2\times10^{15}$ atoms/$cm^2$. The annealing was performed at 1,000° C. for 120 minutes.

Representative values of carrier concentration per $cm^3$ and type (n or p), versus depth in microns (in parenthesis) are: $10^{18}$n (0.0), $6\times10^{18}$n (0.1), $10^{19}$n (0.2), $6\times10^{18}$n (0.4), $2\times10^{17}$n (0.6), $7\times10^{15}$n (0.74), $1.5\times10^{15}$p (0.75) and $1.5\times10^{15}$p (1.0).

EXAMPLE 17

After formation of a 500 Angstrom oxide layer, argon was implanted at 100 keV energy to an implant dose of $1\times10^{15}$ atoms/$cm^2$. Subsequently, boron difluoride was implanted at an energy of 50 keV to an implant dose of $2\times10^{15}$ atoms/$cm^2$. Phosphorus was implanted at an energy of 100 keV to a dose of $1\times10^{14}$ atoms/$cm^2$. The annealing treatment was performed at 900° C. for 180 minutes.

Representative values of carrier concentration per $cm^3$ and type (n or p), versus depth in microns (in parenthesis) are: $7\times10^{18}$p (0.0), $2\times10^{19}$p (0.1), $5\times10^{17}$p (0.2), $10^{17}$p (0.25), $3\times10^{15}$n (0.26), $3\times10^{15}$n (0.4) and $2\times10^{15}$n (0.6).

EXAMPLE 18

After formation of a 500 Angstrom oxide layer, argon was implanted at 100 keV energy to an implant dose of $1\times10^{15}$ atoms/$cm^2$. Subsequently, boron difluoride was implanted at an energy of 50 keV to an implant dose of about $2\times10^{15}$ atoms/$cm^2$. The annealing treatment was performed at 900° C. for 180 minutes.

Representative values of carrier concentration per $cm^3$ and type (n or p), versus depth in microns (in parenthesis) are: $10^{19}$p (0.0), $3\times10^{19}$p (0.05), $2\times10^{19}$p (0.1), $8\times10^{18}$p (0.2), $3\times10^{16}$p (0.28), $2\times10^{15}$n (0.3) and $3\times10^{15}$n (0.5).

EXAMPLE 19

After formation of a 500 Angstrom oxide layer, boron difluoride was implanted at 50 keV energy to an implant dose of $2\times10^{15}$ atoms/$cm^2$. Subsequently, phosphorus was implanted at an energy of 100 keV to an implant dose of $1\times10^{14}$ atoms/$cm^2$. The annealing treatment was performed at 900° C. for 180 minutes.

Representative values of carrier concentration per $cm^3$ and type (n or p), versus depth in microns (in parenthesis) are: $10^{19}$p (0.0), $10^{19}$p (0.1), $5\times10^{17}$p (0.16), $3\times10^{16}$n (0.17), $8\times10^{16}$n (0.25), $2\times10^{17}$n (0.3), $4\times10^{16}$n (0.4) and $5\times10^{15}$n (0.6).

EXAMPLE 20

After formation of a 500 Angstrom oxide layer, boron difluoride was implanted at 50 keV energy to an implant dose of $2\times10^{15}$ atoms/$cm^2$. The annealing treatment was performed at 900° C. for 180 minutes.

Representative values of carrier concentration per $cm^3$ and type (n or p), versus depth in microns (in parenthesis) are: $8\times10^{18}$p (0.0), $3\times10^{19}$p (0.1), $7\times10^{18}$p (0.2), $4\times10^{16}$p (0.25), $10^{15}$n (0.26), $2\times10^{15}$n (0.4) and $2\times10^{15}$n (0.6).

EXAMPLE 21

After formation of a 500 Angstrom oxide layer, argon was implanted at 100 keV energy to an implant dose of $1\times10^{15}$ atoms/$cm^2$. Subsequently, arsenic was implanted at an energy of 35 keV to an implant dose of about $4 \times 10^{15}$ atoms/cm$^2$. Boron was implanted at an energy of 100 keV to a dose of about $1 \times 10^{14}$ atoms/cm$^2$. The annealing treatment was performed at 900°C. for 180 minutes.

Representative values of carrier concentration per cm$^3$ and type (n or p), versus depth in microns (in parenthesis) are: $5 \times 10^{18}$n (0.0), $2 \times 10^{18}$n (0.05), $5 \times 10^{17}$n (0.07), $8 \times 10^{17}$p (0.1), $6 \times 10^{17}$p (0.2), $9 \times 10^{16}$p (0.3), $1.5 \times 10^{15}$p (0.4), $1.6 \times 10^{15}$p (0.5) and $1.8 \times 10^{15}$p (0.6).

EXAMPLE 22

After formation of a 500 Angstrom oxide layer, arsenic was implanted at 100 keV energy to an implant dose of $4 \times 10^{15}$ atoms/cm$^2$. Subsequently, boron was implanted at an energy of 35 keV to an implant dose of $1 \times 10^{14}$ atoms/cm$^2$. The annealing treatment was performed at 900° C. for 180 minutes.

Representative values of carrier concentration per cm$^3$ and type (n or p), versus depth in microns (in parenthesis) are: $3 \times 10^{19}$n (0.0), $7 \times 10^{19}$n (0.1), $2 \times 10^{18}$n (0.15), $10^{18}$n (0.16), $3 \times 10^{17}$n (0.17), $2 \times 10^{17}$p (0.2), $7 \times 10^{16}$p (0.3), $10^{16}$p (0.4), $10^{15}$p (0.42) and $10^{15}$p (0.5).

EXAMPLE 23

After formation of a 250 Angstrom oxide layer, argon was implanted at 130 keV energy to an implant dose of $6 \times 10^{15}$ atoms/cm$^2$. Subsequently, arsenic was implanted at an energy of 100 keV to an implant dose of $6 \times 10^{15}$ atoms/cm$^2$. Boron was implanted at an energy of 40 keV to a dose of $6 \times 10^{14}$ atoms/cm$^2$. The annealing treatment was performed at 900° C. for 180 minutes.

Representative values of carrier concentration per cm$^3$ and type (n or p), versus depth in microns (in parenthesis) are: $4 \times 10^{16}$p (0.01), $4 \times 10^{18}$p (0.1), $4 \times 10^{18}$p (0.15), $2 \times 10^{18}$p (0.2), $9 \times 10^{16}$p (0.3), $7 \times 10^{14}$p (0.4) and $8 \times 10^{14}$p (0.5).

EXAMPLE 24

After formation of a 250 Angstrom oxide layer, argon was implanted at 130 keV energy to an implant dose of $2 \times 10^{15}$ atoms/cm$^2$. Subsequently, arsenic was implanted at an energy of 100 keV to an implant dose of $6 \times 10^{15}$ atoms/cm$^2$. Boron was implanted at an energy of 40 keV to a dose of $6 \times 10^{12}$ atoms/cm$^2$. The annealing treatment was performed at 900° C. for 180 minutes.

Representative values of carrier concentration per cm$^3$ and type (n or p), versus depth in microns (in parenthesis) are: $2 \times 10^{19}$n (0.01), $2.5 \times 10^{19}$n (0.05), $1.6 \times 10^{19}$n (0.1), $3 \times 10^{17}$n (0.14), $5 \times 10^{16}$p (0.15), $10^{16}$p (0.2), $3 \times 10^{15}$p (0.25), $8 \times 10^{14}$p (0.3), $5 \times 10^{14}$p (0.4) and $7 \times 10^{14}$p (0.6).

EXAMPLE 25

After formation of a 250 Angstrom oxide layer, argon was implanted at 100 keV energy to an implant dose of $2 \times 10^{15}$ atoms/cm$^2$. Subsequently, arsenic was implanted at an energy of 190 keV to an implant dose of $1 \times 10^{13}$ atoms/cm$^2$. Boron difluoride was implanted at an energy of 50 keV to a dose of $6 \times 10^{15}$ atoms/cm$^2$. The annealing treatment was performed at 900° C. for 180 minutes.

EXAMPLE 26

Argon was implanted at 100 keV energy and to an implant dose of $4 \times 10^{15}$ atoms/cm$^2$. Subsequently, arsenic was implanted at an energy of 190 keV to an implant dose of $1 \times 10^{15}$ atoms/cm$^2$. Boron difluoride was implanted at an energy of 50 keV to a dose of about $6 \times 10^{15}$ atoms/cm$^2$. The annealing treatment was performed at 900° C. for 180 minutes.

EXAMPLE 27

Argon was implanted at 100 keV energy and to an implant dose of $6 \times 10^{15}$ atoms/cm$^2$. Subsequently arsenic was implanted at an energy of 190 keV to an implant dose of $1 \times 10^{15}$ atoms/cm$^2$. Boron difluoride was implanted at an energy of 50 keV to a dose of $6 \times 10^{15}$ atoms/cm$^2$. The annealing treatment was performed at 900° C. for 180 minutes.

While there have been described above various embodiments of the present invention for the purposes of illustrating the manner in which the invention may be used to advantage, it will be appreciated that the invention is not limited to the disclosed embodiments. Accordingly, any modification, variation or equivalent arrangement within the scope of the accompanying claims should be considered to be within the scope of the invention.

What is claimed is:

1. A semiconductor structure having dopant atom depth regions of predetermined concentration and thickness and preselected depth boundaries relative to a top surface of a silicon or germanium substrate, comprising:

a rare gas atom distribution positioned within said preselected depth boundaries of said substrate;

a first dopant atom distribution positioned within substantially the same said preselected depth boundaries as said rare gas atom distribution; and a second dopant atom distribution positioned within substantially the same said preselected depth boundaries as said first dopant atom distribution and said rare gas atom distribution, and means for electrically activating said first dopant atoms by equilibrium annealing, wherein said second dopant atom distribution thickness is reduced and curvature is sharpened for said predetermined concentration for said predefined depth boundaries relative to said semiconductor structure having present within said predefined depth boundaries only said rare gas atom distribution and said first dopant atom distribution.

2. The semiconductor structure as defined in claim 1 wherein said rare gas atom is selected from the group consisting of neon, argon and krypton.

3. The semiconductor structure as defined in claim 2 wherein said first dopant atom and said second dopant atom are selected from the pair group consisting of Li/B, Li/Al, Li/Ga, Li/In, P/B, P/Al, P/Ga, P/In, As/B, As/Ga, As/In, Sb/B, Sb/Al, Sb/Ga, Sb/In, Bi/B, Bi/Al, Bi/Ga, Bi/In, B/Li, B/P, B/As, B/Sb, B/Bi, Al/Li, Al/P, Al/As, Al/Sb, Al/Bi, Ga/Li, Ga/P, Ga/As, Ga/Sb, Ga/Bi, In/Li, In/P, In/As, In/Sb and In/Bi.

4. The semiconductor structure as defined in claim 1 wherein said rare gas atom is neon.

5. The semiconductor structure as defined in claim 1 wherein said first dopant atom is selected from the group consisting of lithium, phosphorus, arsenic, antimony, and bismuth.

6. The semiconductor structure as defined in claim 1 wherein said first dopant atom is selected from the group consisting of boron, aluminum, gallium and indium.

7. A microelectronic circuit component comprising a semiconductor element having said component structure as defined in claim 1.

8. The semiconductor structure as defined in claim 1 further including a third dopant atom distribution overlapping said predefined depth boundaries.

9. The semiconductor structure as defined in claim 8 wherein said third dopant atom is selected from the group consisting of nitrogen and oxygen.

10. The semiconductor structure as defined in claim 9 wherein said third dopant atom is nitrogen and its distribution overlaps said predefined depth boundary nearest said top surface.

11. The semiconductor component structure as defined in claim 9 wherein said third dopant atom is oxygen, and wherein said oxygen dopant atom distribution overlaps said predefined boundary furthest from said top surface.

12. The semiconductor component structure of claim 8 wherein said rare gas, first dopant, second dopant and third dopant atom distributions are selected from the quaternary group consisting of Ar/As/B/N, Ar/As/B/O, Ar/P/B/N and Ar/P/B/O.

* * * * *